(12) United States Patent
Jung et al.

(10) Patent No.: US 12,538,745 B2
(45) Date of Patent: Jan. 27, 2026

(54) SUBSTRATE TRANSFER METHOD AND SUBSTRATE TRANSFER DEVICE

(71) Applicant: JUSUNG ENGINEERING CO., LTD., Gwangju-si (KR)

(72) Inventors: Gu Hyun Jung, Gwangju-si (KR); Jong Chul Kim, Gwangju-si (KR); Jin An Jung, Gwangju-si (KR); Chul Joo Hwang, Gwangju-si (KR); Yeong Seop Byeon, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 791 days.

(21) Appl. No.: 17/793,639

(22) PCT Filed: Jan. 18, 2021

(86) PCT No.: PCT/KR2021/000656
§ 371 (c)(1),
(2) Date: Jul. 18, 2022

(87) PCT Pub. No.: WO2021/145744
PCT Pub. Date: Jul. 22, 2021

(65) Prior Publication Data
US 2023/0051061 A1 Feb. 16, 2023

(30) Foreign Application Priority Data
Jan. 17, 2020 (KR) .......................... 10-2020-0006360

(51) Int. Cl.
*H01L 21/68* (2006.01)
*H01L 21/67* (2006.01)
(Continued)

(52) U.S. Cl.
CPC .. *H01L 21/67742* (2013.01); *H01L 21/67259* (2013.01); *H01L 21/67748* (2013.01); *H01L 21/68714* (2013.01)

(58) Field of Classification Search
CPC ......... H01L 21/67742; H01L 21/67259; H01L 21/67748; H01L 21/68714;
(Continued)

(56) References Cited

U.S. PATENT DOCUMENTS

| 5,537,311 A | 7/1996 | Stevens |
| 6,522,942 B2 * | 2/2003 | Kondo .................. H01L 21/681 700/218 |

(Continued)

FOREIGN PATENT DOCUMENTS

| CN | 107529670 A | 1/2018 |
| JP | 2009081267 A | 4/2009 |

(Continued)

OTHER PUBLICATIONS

International Search Report for PCT/KR2021/000656 mailed May 13, 2021.

*Primary Examiner* — Patrick H Mackey
(74) *Attorney, Agent, or Firm* — Renaissance IP Law Group LLP

(57) ABSTRACT

The present disclosure relates to a substrate transfer method and apparatus which controls a substrate transfer robot using position information of a substrate, when the substrate is loaded or unloaded in the substrate transfer apparatus including the substrate transfer robot. When an operation of setting a new reference value due to a change in process or hardware after setting the initial reference value for loading or unloading the substrate is requested, the substrate transfer method and apparatus can automatically perform the reference value setting operation. Therefore, the substrate transfer method and apparatus can transfer the substrate such that (Continued)

(a)

(b)

the substrate is located in the center of the susceptor, even though the reference value of the substrate transfer robot is not manually changed.

9 Claims, 6 Drawing Sheets

(51) Int. Cl.
*H01L 21/677* (2006.01)
*H01L 21/687* (2006.01)

(58) Field of Classification Search
CPC ......... H01L 21/67201; H01L 21/67754; H01L 21/681; H01L 21/68; H01L 21/68707
See application file for complete search history.

(56) References Cited

U.S. PATENT DOCUMENTS

| | | | |
|---|---|---|---|
| 8,140,181 B2* | 3/2012 | Ogi | H01L 21/67265 |
| | | | 700/214 |
| 9,227,320 B2* | 1/2016 | Hiroki | H01L 21/67259 |
| 9,620,402 B2* | 4/2017 | Kodama | H01L 21/681 |
| 10,042,356 B2* | 8/2018 | Iida | G05B 19/4189 |
| 10,395,968 B2* | 8/2019 | Kuwahara | H01L 21/681 |
| 10,651,065 B2* | 5/2020 | Hiester | H01L 21/67748 |
| 12,183,612 B2* | 12/2024 | Hatano | H01L 21/68707 |
| 2019/0172738 A1 | 6/2019 | Hiester et al. | |
| 2020/0185257 A1* | 6/2020 | Nishiwaki | H01L 21/67742 |
| 2020/0194296 A1* | 6/2020 | Numakura | H01L 21/6831 |
| 2021/0384058 A1* | 12/2021 | Harada | B65G 47/90 |

FOREIGN PATENT DOCUMENTS

| | | |
|---|---|---|
| JP | 2013162029 A | 8/2013 |
| KR | 20060117621 A | 11/2006 |
| KR | 20140147959 A | 12/2014 |
| KR | 101620545 B1 | 5/2016 |
| KR | 20160066824 A | 6/2016 |
| KR | 20160146289 A | 12/2016 |
| KR | 20190031857 A | 3/2019 |
| TW | 530023 B | 5/2003 |

* cited by examiner (a)

(b)

SUBSTRATE TRANSFER METHOD AND SUBSTRATE TRANSFER DEVICE

BACKGROUND

1. Technical Field

The present disclosure relates to a substrate transfer method and apparatus of a semiconductor fabrication device to fabricate a semiconductor device, and particularly, to a substrate transfer method and apparatus which controls a substrate transfer robot using position information of a substrate, when the substrate is loaded or unloaded in the substrate transfer apparatus including the substrate transfer robot to load or unload the substrate.

2. Related Art

In general, a thin film deposition process, a photolithography process, an etching process and the like are performed in order to fabricate a semiconductor device, and each of the processes is performed in a chamber designed as the optimal environment for the corresponding process. The thin film deposition process refers to a process of forming thin films by depositing a raw material on a silicon wafer, the photolithography process refers to a process of exposing or concealing a region selected among the thin films using a photosensitive material, and the etching process refers to a process of patterning the selected region in a refers to a process of patterning the selected region in a desired manner by removing the thin film of the selected region.

Recently, a cluster-type substrate processing apparatus is used a lot in order to increase productivity. The cluster-type substrate processing apparatus includes a plurality of process modules, a transfer module and the like, which are closely coupled to one another, the transfer module serving to transfer a substrate.

FIG. 1 is a plan view schematically illustrating a configuration of the cluster-type substrate processing apparatus. The cluster-type substrate processing apparatus includes a plurality of process modules 20 and a load lock module 30, which are coupled around a transfer module 10.

The transfer module 10 includes a transfer robot 40 installed therein, the transfer robot 40 serving to transfer a substrate S. The substrate S is moved among the process modules 20 and the load lock module 30 by the transfer robot 40. The transfer module 10 always maintains a vacuum state except the case in which setting or maintenance is needed.

The process module 20 is where actual processes such as thin film deposition and etching are performed on the substrate S within a process chamber, and includes a substrate seating unit in which the substrate is seated within the process chamber, the substrate seating unit including a susceptor in which a plurality of substrates can be placed.

The load lock module 30 serves as a buffer space in which the substrate S temporarily stays, when the substrate S is transferred into or out of each of the process modules 20 in a vacuum state. Typically, in consideration of productivity, a structure in which two chambers are vertically stacked is used a lot as the load lock module 30.

Therefore, the load lock module 30 is switched to a vacuum state when the substrate S is transferred into the process module 20 from the outside, and switched to an atmospheric state when the substrate S is transferred to the outside from the process module 20.

FIG. 2 is a side cross-sectional view of the cluster-type substrate processing apparatus. The cluster-type substrate processing apparatus has a structure in which the load lock module 30 and the process modules 20 are coupled to the edge of the transfer module 10, and the transfer module 10 includes a chamber 11 and the transfer robot 40 operating in the chamber 11.

The transfer robot 40 includes a driving unit frame 41, a driving shaft 43, a robot arm 44 and a substrate seating unit 45. The driving unit frame 41 supports a driving unit such as a motor, the driving shaft 43 is extended from the top of the driving unit frame 41, and rotated and lifted/lowered by the driving unit, the robot arm 44 is not only rotated and lifted/lowered by the driving shaft 43 but also expanded and contracted by the driving shaft 43, and the substrate seating unit 45 is coupled to an end of the robot arm 44 so as to directly lift the substrate S.

The driving unit frame 41 is fixed through a chamber bottom surface 12. In particular, a flange 42 is formed on a portion of the driving unit frame 41, positioned in the chamber 11, so as to protrude along the outer circumferential surface thereof, and welded to the chamber bottom surface 12, thereby maintaining the vacuum state of the chamber 11.

The transfer robot 40, which transfers the substrate S to the process module 20 or the load lock module 30 through the rotation and lifting/lowering motion of the driving shaft 43 and the horizontal motion of the substrate seating unit 45, needs to operate very precisely within a limited space.

Therefore, when the apparatus is set, a process of setting a reference position as the reference point of the operation of the transfer robot 40 is necessarily performed.

That is, in order for the transfer robot 40 to load the substrate to a regular position of the susceptor within the process chamber 21 or unload the substrate from the susceptor within the process chamber 21, various pieces of information are required. The various pieces of information include information on how much the transfer robot 40 is to be lifted/lowered, the rotation angle of the transfer robot 40, and the stretching amount of the robot arm, based on the design position of the transfer robot 40 and the position of the susceptor within the process chamber 21.

Based on such pieces of information, a skilled robot engineer acquires data suitable for the apparatus through a tool such as a teaching pendant during the initial setup operation of the apparatus, and manually inputs the data to complete the initial setup operation. Then, due to a hardware change such as a replacement of the susceptor within the process chamber 21, a reference value needs to be newly set in many cases.

Considering that the environment where the transfer robot 40 is actually operated is a vacuum state, it is desirable that the process of setting an initial reference value is performed in a vacuum state. In most cases, however, the robot engineer performs an operation while checking with the naked eye or using a separate tool. In this case, the reference value setting operation is performed in an atmospheric state.

After the initial reference value setting operation is performed in the atmospheric state, the process chamber 21 is switched to the vacuum state through a vacuum pumping process and a heating-up process. During such a vacuum pumping process or heating-up process, the reference value setting operation may need to be newly performed due to a change in position of the susceptor within the process chamber 21.

SUMMARY

Various embodiments are directed to a substrate transfer method and apparatus, which can automatically perform an operation of correcting a reference value to a new reference value after setting the reference value serving as a reference value when a substrate transfer robot loads or unloads a substrate, when the correction operation is requested, thereby accurately locating the substrate in the center of a susceptor within a chamber.

In an embodiment, a substrate transfer method may include: a first substrate loading step of loading a substrate into a susceptor within a chamber by using a first reference value which serves as a reference value when a substrate transfer robot loads or unloads the substrate into or from the susceptor; a first position adjusting step of adjusting the position of the substrate to a first position of the susceptor; a first substrate unloading step of unloading the substrate using the substrate transfer robot; a first value acquisition step of acquiring a first value when the substrate is unloaded; and a first correction step of correcting the first value to a second reference value of the substrate transfer robot, when the first reference value and the first value are different from each other.

In an embodiment, a substrate transfer apparatus may include: a chamber including a susceptor in which at least one substrate is seated; a substrate transfer robot configured to load or unload the substrate into or from the susceptor; a substrate position sensing unit configured to sense the position of the substrate when the substrate is loaded into or unloaded from the chamber; a storage unit configured to store the position of the substrate, sensed by the substrate position sensing unit; and a control unit configured to control the substrate transfer robot to seat the substrate at a first position of the susceptor, using information on the position of the substrate.

The substrate transfer method and apparatus in accordance with the embodiments of the present disclosure can automatically perform an operation of setting a new reference value due to a change in process or hardware after setting the initial reference value for loading or unloading the substrate, when the reference value setting operation is requested. Therefore, the substrate transfer method and apparatus can transfer the substrate such that the substrate is located in the center of the susceptor, even though the reference value of the substrate transfer robot is not manually changed.

As a result, the substrate may be accurately located in the center of the susceptor in the chamber without an error depending on the skill level of an engineer or an error depending on an environmental change to a vacuum state or a high-temperature state.

DETAILED DESCRIPTION

Hereafter, exemplary embodiments of the present disclosure will be described in detail with reference to the accompanying drawings. The terms used in this specification and claims should not be construed as being limited as typical and dictionary meanings, but be construed as meanings and concepts which coincide with the technical matters of the present disclosure.

The components illustrated in the embodiments and drawings described in this specification are preferred embodiments of the present disclosure and do not represent all the technical ideas of the present disclosure. Thus, various equivalents and modifications, which can substitute the embodiments, may be present at the time of filing the present application.

Figure 1:
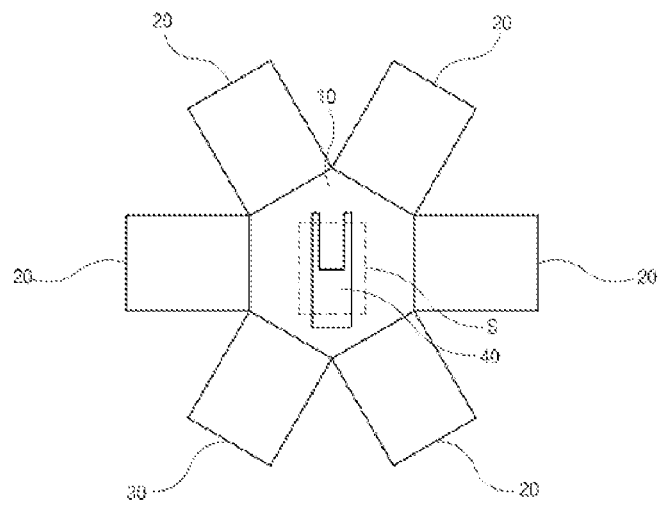
FIG. 1 is a plan view illustrating a schematic configuration of a conventional cluster-type substrate processing apparatus.
Figure 2:
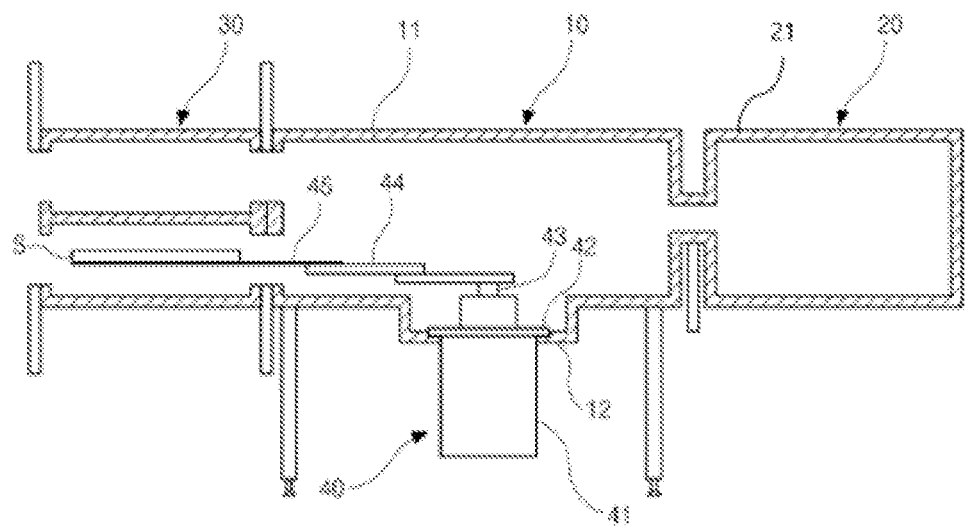
FIG. 2 is a side cross-sectional view of the cluster-type substrate processing apparatus illustrated in FIG. 1.
Figure 3:
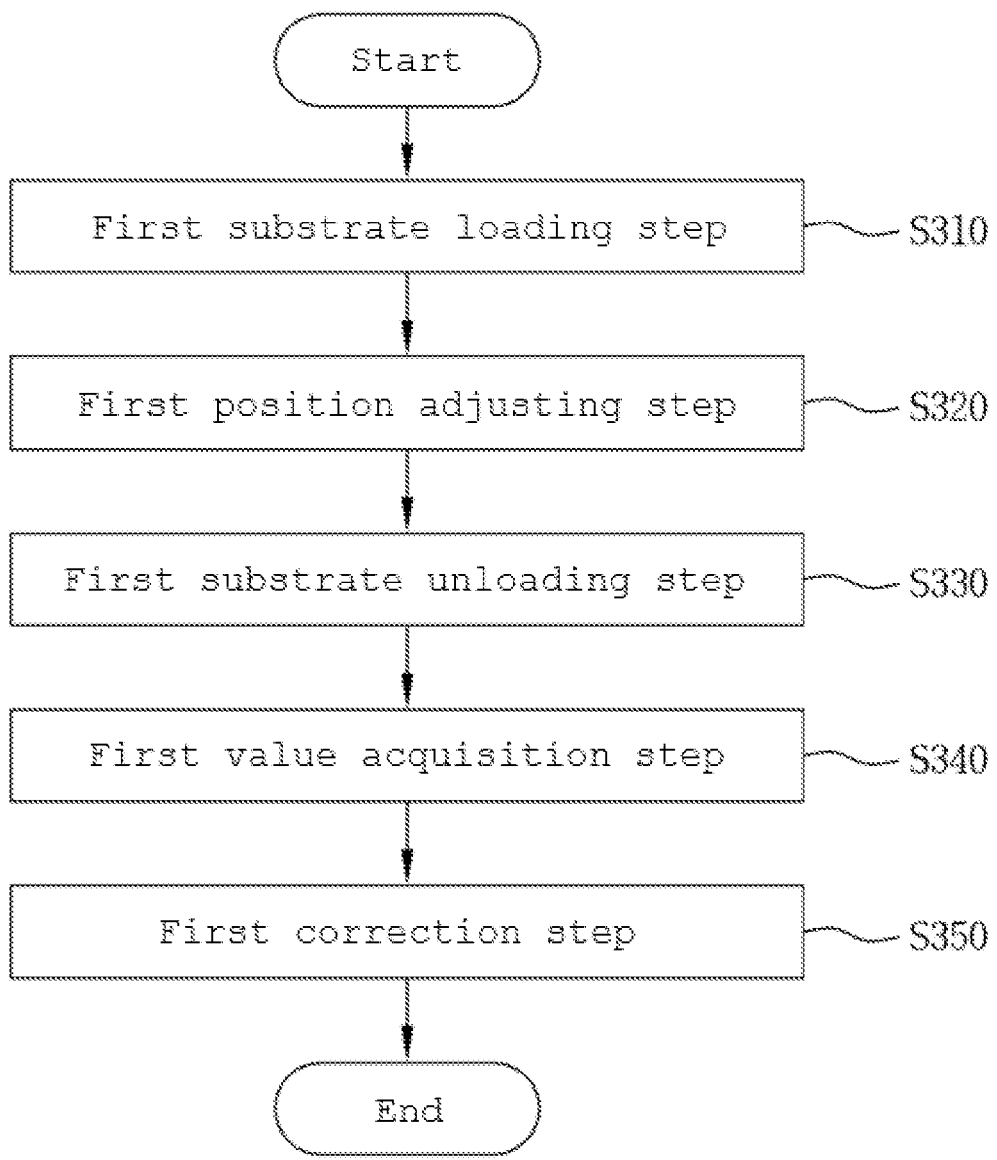
FIG. 3 is a flowchart illustrating a substrate transfer method in accordance with an embodiment of the present disclosure.

FIG. 3 is a flowchart illustrating a substrate transfer method in accordance with an embodiment of the present disclosure.

Referring to FIG. 3, the substrate transfer method in accordance with the embodiment of the present disclosure includes a first substrate loading step S310, a first position adjusting step S320, a first substrate unloading step S330, a first value acquisition step S340 and a first correction step S350.

The first substrate loading step S310 includes loading a substrate W into a susceptor within a chamber by using a first reference value which serves as a reference value when a substrate transfer robot loads or unloads the substrate W into or from the susceptor. At this time, the first reference value serves as a reference value when the substrate transfer robot loads or unloads the substrate W according to a design value.

The first position adjusting step S320 includes adjusting the position of the substrate W loaded in the susceptor, such that the substrate is located at a first position of the susceptor. At this time, the first position may be set to the center of the susceptor. Specifically, the position of the substrate may be adjusted so that the substrate W is located in the center of a substrate seating groove (not illustrated).

Although the substrate W is loaded into the susceptor within the chamber by the substrate transfer robot according to the first reference value as the design value, the substrate W may not be accurately located in the center of the susceptor due to various factors in hardware. Therefore, a centering process of locating the substrate W in the center of the susceptor is needed.

The first substrate unloading step S330 includes unloading the substrate from the susceptor within the chamber according to the first reference value by using the substrate transfer robot. Since the separate operation of locating the substrate in the center of the susceptor was performed in the first position adjusting step S320, the substrate is located in the center of the susceptor at a different position from the first reference value. Therefore, when the substrate is unloaded according to the first reference value in the first substrate unloading step S330, the substrate is unloaded while placed at a position dislocated from a substrate seating unit of the substrate transfer robot, not a regular position.

The first value acquisition step S340 includes sensing the dislocated amount of the substrate with respect to the first reference value through a substrate position sensing unit when the substrate is unloaded, and acquiring a first value which is position information when the substrate is unloaded.

In the first value acquisition step S340, the length of the substrate, sensed by the substrate position sensing unit when the substrate is unloaded from the susceptor, may be measured and compared to the length of the substrate, sensed by the substrate position sensing unit when the substrate is loaded according to the first reference value, in order to acquire the first value which is position information when the substrate is unloaded.

In the first value acquisition step S340, the time at which the substrate is sensed by the substrate position sensing unit when the substrate is unloaded from the susceptor may be measured and compared to the time at which the substrate is sensed by the substrate position sensing unit when the substrate is loaded according to the first reference value, in order to acquire the first value which is position information when the substrate is unloaded.

The first correction step S350 includes comparing the first value and the first reference value, and correcting the first value to a second reference value which is a new reference value of the substrate transfer robot, when the first value and the first reference value are different from each other.

That is, the dislocated amount of the substrate from the substrate transfer robot, sensed by the substrate position sensing unit, is used to set the second reference value, and the second reference value is used to control the substrate transfer robot.

The substrate transfer method of FIG. 3 can automatically correct the reference value even when the reference value is changed by an error in a hardware assembly process after the first reference value is set according to the design value. Therefore, even though the reference value of the substrate transfer robot is not manually changed, the substrate can be transferred so as to be located in the center of the susceptor.

Figure 4:
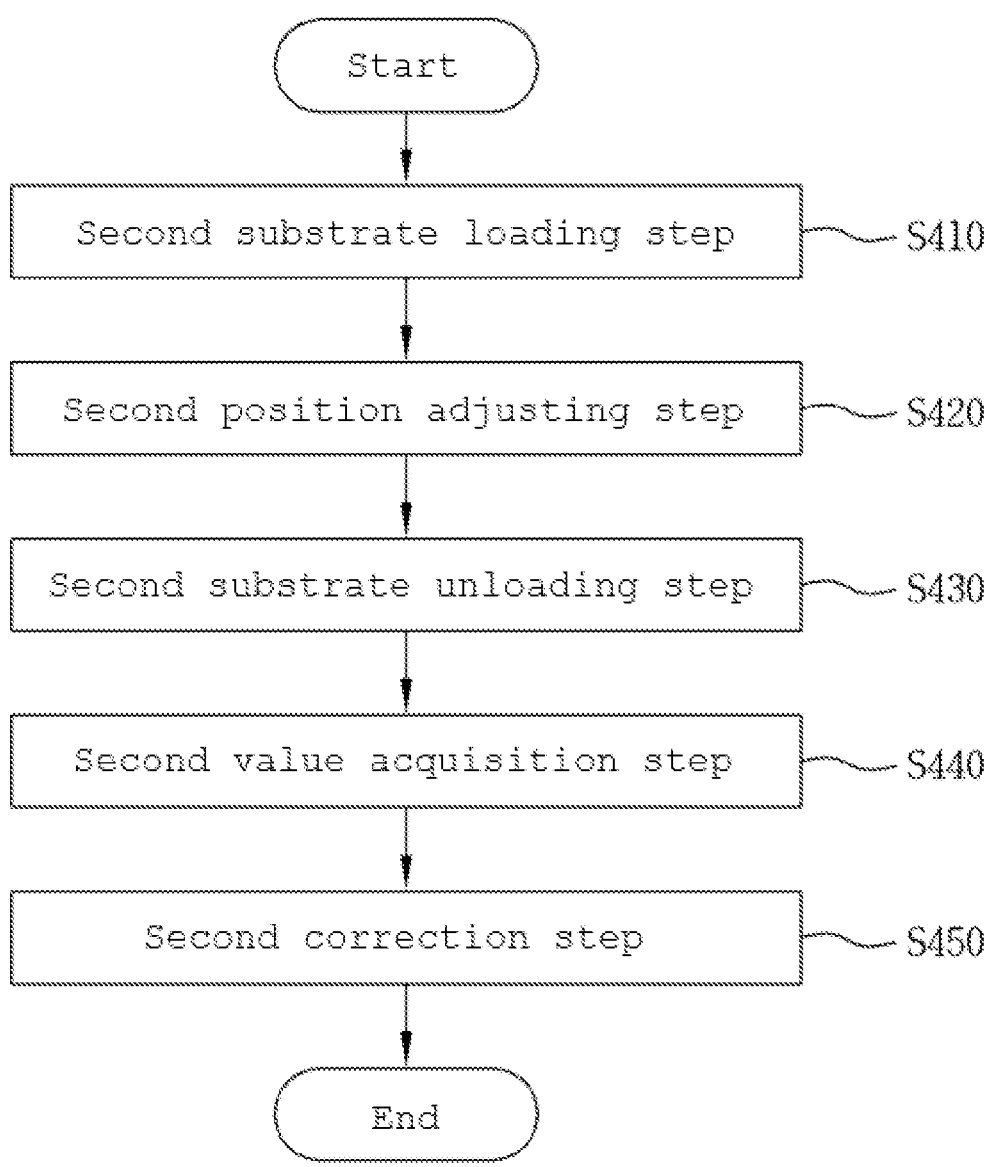
FIG. 4 is a flowchart illustrating a substrate transfer method in accordance with another embodiment of the present disclosure.

FIG. 4 is a flowchart illustrating a substrate transfer method in accordance with another embodiment of the present disclosure.

Referring to FIG. 4, the substrate transfer method in accordance with the another embodiment of the present disclosure includes a second substrate loading step S410, a second position adjusting step S420, a second substrate unloading step S430, a second value acquisition step S440 and a second correction step S450.

The second substrate loading step S410 includes loading the substrate into the susceptor using the second reference value. At this time, the second reference value may be a value which serves as a reference value when the substrate is loaded or unloaded according to the value corrected in the first correction step S350 of the substrate transfer method illustrated in FIG. 3. On the other hand, the second reference value may be a value which serves as a reference value when the substrate transfer robot loads or unloads the substrate according to the initial design value.

The second position adjusting step S420 includes adjusting the position of the substrate loaded in the susceptor, such that the substrate is located at a second position of the susceptor. At this time, the second position may be set to the center of the susceptor. Specifically, the position of the substrate may be adjusted so that the substrate is located in the center of a substrate seating groove (not illustrated).

Although the substrate W was loaded into the susceptor within the chamber by the substrate transfer robot according to the second reference value, the substrate may not be accurately located in the center of the susceptor when the chamber is vacuum pumped or heated up. Therefore, a centering process of locating the substrate W in the center of the susceptor is needed.

The second substrate unloading step S430 includes unloading the substrate from the susceptor within the chamber according to the second reference value by using the substrate transfer robot. Since the separate operation of locating the substrate in the center of the susceptor was performed in the second position adjusting step S420, the substrate is located in the center of the susceptor at a different position from the second reference value. Therefore, when the substrate is unloaded according to the second reference value in the second substrate unloading step S430, the substrate is unloaded while placed at a position dislocated from the substrate seating unit of the substrate transfer robot, not a regular position.

The second value acquisition step S440 includes sensing the dislocated amount of the substrate with respect to the second reference value through the substrate position sensing unit when the substrate is unloaded, and acquiring a second value which is position information when the substrate is unloaded.

In the second value acquisition step S440, the length of the substrate, sensed by the substrate position sensing unit when the substrate is unloaded from the susceptor, may be measured and compared to the length of the substrate, sensed by the substrate position sensing unit when the substrate is loaded according to the second reference value, in order to acquire the second value which is position information when the substrate is unloaded.

In the second value acquisition step S440, the time at which the substrate is sensed by the substrate position sensing unit when the substrate is unloaded from the susceptor may be measured and compared to the time at which the substrate is sensed by the substrate position sensing unit when the substrate is loaded according to the second reference value, in order to acquire the second value which is position information when the substrate is unloaded.

The second correction step S450 includes comparing the second value and the second reference value, and correcting the second value to a third reference value which is a new reference value of the substrate transfer robot, when the second value and the second reference value are different from each other.

That is, the dislocated amount of the substrate from the substrate transfer robot, sensed by the substrate position sensing unit, is used to set the third reference value, and the third reference value is used to control the substrate transfer robot.

The substrate transfer method of FIG. 4 can set the reference value according to the design value in an atmospheric state, and then automatically correct the reference value even when the reference value is changed by the vacuum pumping process and the heat-up process, such that the substrate can be transferred without an error due to an environmental change.

Figure 5:
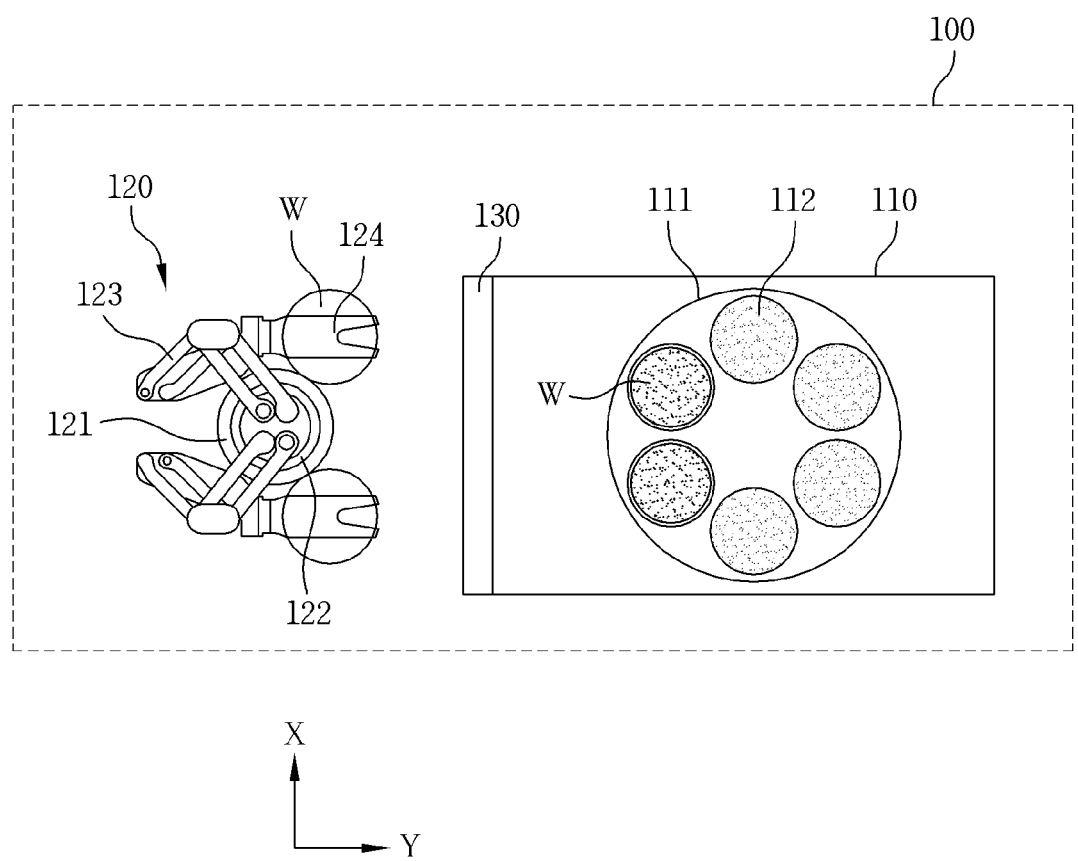
FIG. 5 is a schematic view illustrating a configuration of a substrate transfer apparatus in accordance with an embodiment of the present disclosure.
Figure 6:
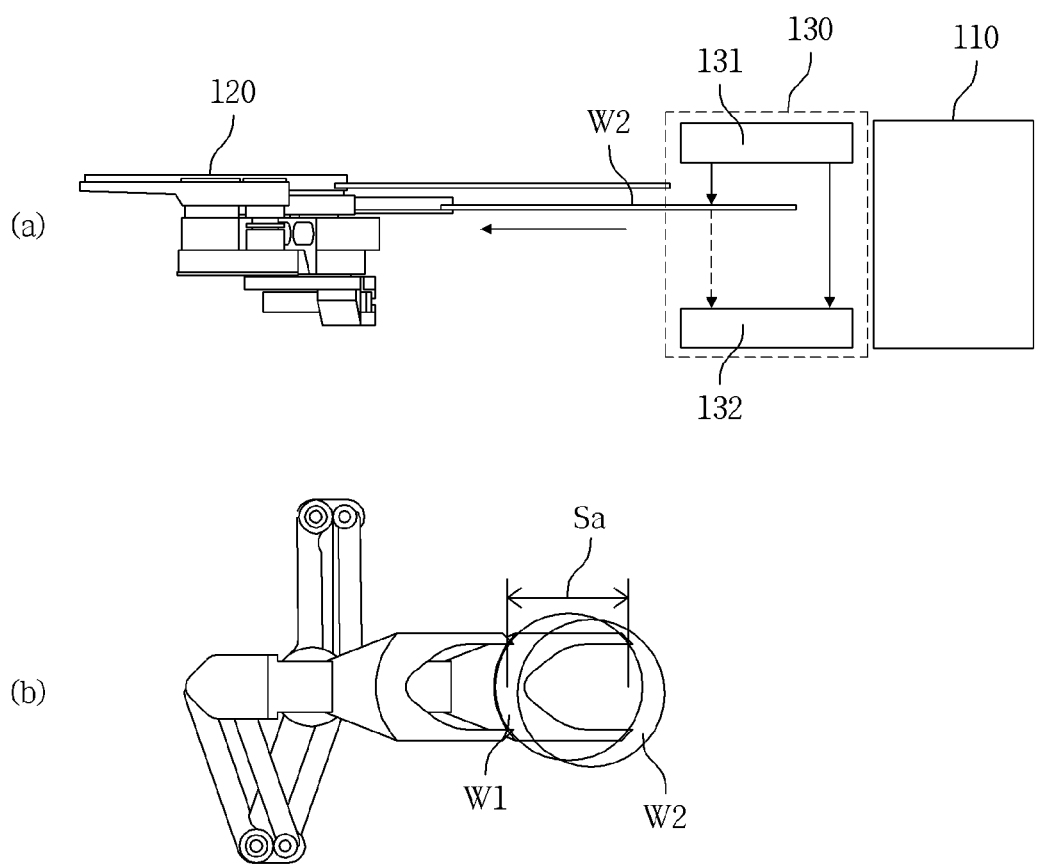
FIG. 6 is diagrams for describing the principle to sense the position of a substrate in the substrate transfer apparatus in accordance with the embodiment of the present disclosure.
Figure 7:
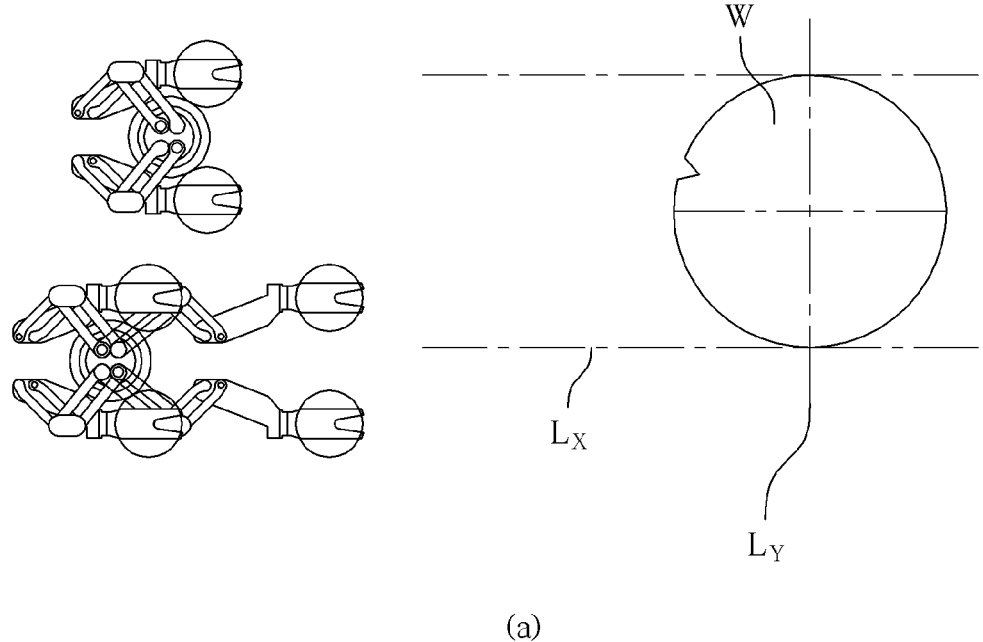
FIG. 7 is diagrams for describing the principle to sense the position of the substrate in the substrate transfer apparatus in accordance with the embodiment of the present disclosure.
Figure 7:
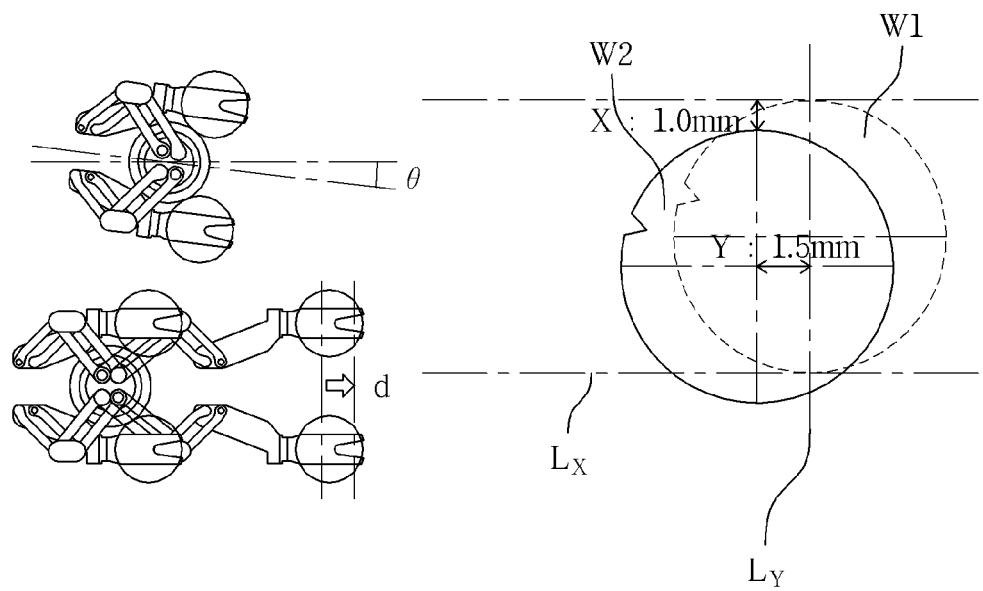

FIG. 5 is a schematic view illustrating a configuration of a substrate transfer apparatus in accordance with an embodiment of the present disclosure, and FIGS. 6 and 7 are diagrams for describing the principle to sense the position of a substrate in the substrate transfer apparatus in accordance with the embodiment of the present disclosure.

As illustrated in FIG. 5, a substrate transfer apparatus 100 in accordance with an embodiment of the present disclosure includes a chamber 110, a substrate transfer robot 120, a substrate position sensing unit 130, a storage unit (not illustrated) and a control unit (not illustrated).

The chamber 110 may be a load lock chamber, a transfer chamber or a process chamber. Desirably, the chamber 110 may be configured as the process chamber for processing a substrate. The process chamber serves as a space in which a process is performed, and gas required for the process is introduced into the process chamber. If necessary, a vacuum pumping process, a heat-up process or a plasma treatment may be performed.

The chamber 110 includes a substrate support unit 111 installed therein and a susceptor 112 located at the top of the substrate support unit 111, the susceptor 112 having a substrate located therein.

The substrate transfer robot 120 loads or unloads the substrate W into or from the susceptor 112 within the chamber 110.

The substrate position sensing unit 130 is installed at the entrance of the chamber 110, through which the substrate transfer robot 120 enters and exits, and senses the position of the substrate W when the substrate W is loaded into the susceptor 112 within the chamber 110 by the substrate transfer robot 120 and when the substrate W is unloaded from the susceptor 112 within the chamber 110.

The storage unit (not illustrated) stores the position of the substrate, sensed by the substrate position sensing unit 130, and the control unit (not illustrated) controls the motion of the substrate transfer robot 120 using information on the position of the substrate.

The substrate transfer robot 120 includes a main body 121, a lift/lowering module 122 lifted or lowered along the main body, a robot arm 123 connected to the lift/lowering module 122, and a substrate seating unit 124 connected to an end of the robot arm 123. The substrate transfer robot 120 is controlled according to the position information of the substrate, sensed by the substrate position sensing unit 130. Specifically, the rotation amount and stretching amount of the robot arm 123 may be controlled.

Referring to FIG. 6, the substrate position sensing unit 130 may include a light emitter 131 and a light receiver 132. The substrate position sensing unit 130 may measure the time during which light from the light emitter 131 is not transferred to the light receiver 132, when a substrate W2 is passed between the light emitter 131 and the light receiver 132, and compare the measured time to a time based on an initial reference value, thereby sensing the position of the substrate W2 based on an X-axis coordinate value and a Y-axis coordinate value. Then, the substrate position sensing unit 130 may sense the dislocated amount of the substrate using the sensed position.

The substrate position sensing unit 130 may measure a length of the substrate, by which light from the light emitter 131 is not transferred to the light receiver 132, i.e. a length based on a sensing area Sa of the substrate position sensing unit 130, instead of measuring the time during which light from the light emitter 131 is not transferred to the light receiver 132, and compare the measured length to a preset reference length, thereby sensing the dislocated amount of the substrate.

So far, it has been described that the substrate position sensing unit 130 includes the light emitter and the light receiver, and the sensor for sensing a target object located between the light emitter and the light receiver is used. However, the present embodiment is not limited thereto, but various sensors capable of measuring the position of a target object may be used.

The dislocated amount of the substrate may indicate the amount by which the substrate W2 is dislocated in an X-axis direction set to a first horizontal direction parallel to the entrance of the chamber 110 and a Y-axis direction set to a second horizontal direction perpendicular to the X-axis direction, compared to a first reference value which is the initial reference value based on the design value.

FIG. 7(a) illustrates that the substrate W is located at a regular position on an X-axis sensing reference line LX and a Y-axis sensing reference line LY of the substrate position sensing unit 130 according to the first reference value. On the other hand, FIG. 7(b) illustrates that the substrate W2 is dislocated by 1.0 mm in the X-axis direction and 1.5 mm in the Y-axis direction, compared to the substrate W1 at the regular position.

When the substrate W2 is dislocated by 1.0 m in the X-axis direction and 1.5 mm in the Y-axis direction in comparison to the substrate W1 at the regular position as illustrated in FIG. 7(b), the dislocated amount of 1.0 mm in the X-axis direction may be reflected to calibrate the X-axis such that a rotation angle $\theta$ of the substrate transfer robot 120 is moved a little more to the right. Then, the changed rotation angle $\theta$ is considered and the dislocated amount of 1.5 mm in the Y-axis direction is reflected to change the stretching amount d of the robot arm of the substrate transfer robot 120, in order to calibrate the Y-axis.

That is, the control unit (not illustrated) may acquire a second reference value as a new reference value by correcting the X-axis coordinate value by adjusting the rotation angle $\theta$ of the robot arm 123 according to the dislocated amount of 1.0 mm in the X-axis direction and correcting the Y-axis coordinate value by adjusting the stretching amount d of the robot arm 123 according to the dislocated amount of 1.5 mm in the Y-axis direction, and then correct the reference value of the substrate transfer robot by using the second reference value as the new reference value.

As described above, when an operation of setting a new reference value is required due to a change in process or hardware after the reference value is set according to the design value, the reference value setting operation may be automatically performed. Therefore, although the reference value of the substrate transfer robot is not manually changed, the substrate may be transferred so as to be located in the center of the susceptor.

What is claimed is:

1. A substrate transfer method comprising:
    a first substrate loading step of loading a substrate into a susceptor within a chamber by using a first reference value which serves as a reference value when a substrate transfer robot loads or unloads the substrate into or from the susceptor;
    a first position adjusting step of adjusting the position of the substrate to a first position of the susceptor;
    a first substrate unloading step of unloading the substrate using the substrate transfer robot;
    a first value acquisition step of acquiring a first value when the substrate is unloaded; and
    a first correction step of correcting the first value to a second reference value of the substrate transfer robot, when the first reference value and the first value are different from each other,
    wherein in the first value acquisition step, the length of the substrate, sensed by a substrate position sensing unit when the substrate is unloaded from the susceptor, is measured and compared to the length of the substrate, sensed by the substrate position sensing unit when the substrate is loaded according to the first reference value, in order to acquire the first value which is position information when the substrate is unloaded.

2. The substrate transfer method of claim 1, wherein in the first value acquisition step, the time at which the substrate is sensed by a substrate position sensing unit when the substrate is unloaded from the susceptor is measured and compared to the time at which the substrate is sensed by the substrate position sensing unit when the substrate is loaded according to the first reference value, in order to acquire the first value which is position information when the substrate is unloaded.

3. A substrate transfer method comprising:
a second substrate loading step of loading a substrate into a susceptor within a chamber by using a second reference value which serves as a reference value when a substrate transfer robot loads or unloads the substrate into or from the susceptor;
a second position adjusting step of adjusting the position of the substrate to a second position of the susceptor;
a second substrate unloading step of unloading the substrate using the substrate transfer robot;
a second value acquisition step of acquiring a second value when the substrate is unloaded; and
a second correction step of correcting the second value to a third reference value of the substrate transfer robot, when the second reference value and the second value are different from each other,
wherein in the second value acquisition step, the length of the substrate, sensed by the substrate position sensing unit when the substrate is unloaded from the susceptor, is measured and compared to the length of the substrate, sensed by the substrate position sensing unit when the substrate is loaded according to the second reference value, in order to acquire the second value which is position information when the substrate is unloaded.

4. The substrate transfer method of claim 3, wherein in the second value acquisition step, the time at which the substrate is sensed by the substrate position sensing unit when the substrate is unloaded from the susceptor is measured and compared to the time at which the substrate is sensed by the substrate position sensing unit when the substrate is loaded according to the second reference value, in order to acquire the second value which is position information when the substrate is unloaded.

5. A substrate transfer apparatus comprising:
a chamber comprising a susceptor in which at least one substrate is seated;
a substrate transfer robot configured to load or unload the substrate into or from the susceptor;
a substrate position sensing unit configured to sense the position of the substrate when the substrate is loaded into or unloaded from the chamber;
a storage unit configured to store the position of the substrate, sensed by the substrate position sensing unit; and
a control unit configured to control the substrate transfer robot to seat the substrate at a first position of the susceptor, using information on the position of the substrate,
wherein the substrate position sensing unit senses the position of the substrate when the substrate is loaded, by measuring the length of the substrate, sensed when the substrate is loaded into the susceptor, and senses the position of the substrate when the substrate is unloaded, by measuring the length of the substrate, sensed when the substrate is unloaded from the susceptor.

6. The substrate transfer apparatus of claim 5, wherein the substrate transfer robot is controlled in response to information on the position of the substrate, sensed by the substrate position sensing unit.

7. The substrate transfer apparatus of claim 5, wherein the substrate position sensing unit senses the position of the substrate when the substrate is loaded, by measuring the time at which the substrate is sensed when loaded into the susceptor, and senses the position of the substrate when the substrate is unloaded, by measuring the time at which the substrate is sensed when unloaded from the susceptor.

8. The substrate transfer apparatus of claim 7, wherein the control unit controls the substrate transfer robot by using information on the position of the substrate when the substrate is loaded and information on the position of the substrate when the substrate is unloaded.

9. The substrate transfer apparatus of claim 5, wherein the control unit controls the substrate transfer robot by using information on the position of the substrate when the substrate is loaded and information on the position of the substrate when the substrate is unloaded.

* * * * *